United States Patent [19]
Chi et al.

[11] Patent Number: 5,847,422
[45] Date of Patent: Dec. 8, 1998

[54] MOS-BASED ACTIVE PIXEL SENSOR CELL THAT UTILIZES THE PARASITIC BIPOLAR ACTION OF THE CELL TO OUTPUT IMAGE DATA

[75] Inventors: Min-Hwa Chi, Palo Alto; Lih-Ying Ching, Cupertino; Albert Bergemont, Palo Alto, all of Calif.

[73] Assignee: Foveonics, Inc., Cupertino, Calif.

[21] Appl. No.: 858,509

[22] Filed: May 19, 1997

[51] Int. Cl.$^6$ .............. H01L 31/062; H01L 31/113; H01L 27/01; H01L 27/12
[52] U.S. Cl. .............. 257/291; 257/290; 257/353; 257/354
[58] Field of Search .............. 257/290, 291, 257/347, 353, 354

[56] References Cited

U.S. PATENT DOCUMENTS

| | | | |
|---|---|---|---|
| 5,065,206 | 11/1991 | Nishizawa et al. | 357/30 |
| 5,260,592 | 11/1993 | Mead et al. | 257/291 |
| 5,587,596 | 12/1996 | Chi et al. | 257/223 |
| 5,591,988 | 1/1997 | Arai et al. | 257/59 |

*Primary Examiner*—Ngân V. Ngô
*Attorney, Agent, or Firm*—Limbach & Limbach L.L.P.

[57] ABSTRACT

A MOS-based active pixel sensor cell utilizes the parasitic bipolar action of the cell to produce a horizontal current in lieu of the vertical image current associated with conventional bipolar-based active pixel sensor cells. Image data is collected during an integration period by applying a negative voltage to the gate of the MOS transistor which is sufficient to reverse-bias both the source/body and drain/body junctions. Following this, the image data is read out by raising the gate voltage such that the source/body junction remains reverse-biased, and the drain/body junction becomes forward-biased. Under these bias conditions, an amplified horizontal image current flows from the source, through the body, and out of the drain.

17 Claims, 7 Drawing Sheets

MOS-BASED ACTIVE PIXEL SENSOR CELL THAT UTILIZES THE PARASITIC BIPOLAR ACTION OF THE CELL TO OUTPUT IMAGE DATA

BACKGROUND OF THE INVENTION

1. Field of the Invention

The present invention relates to MOS-based active pixel sensor cells and, more particularly, to a MOS-based active pixel sensor cell that utilizes the parasitic bipolar action of the cell to output image data.

2. Description of the Related Art

Charge-coupled devices (CCDs) have been the mainstay of conventional imaging circuits for converting a pixel of light energy into an electrical signal that represents the intensity of the light energy. In general, CCDs utilize a photogate to convert the light energy into an electrical charge, and a series of electrodes to transfer the charge collected at the photogate to an output sense node.

Although CCDs have many strengths, which include a high uniformity and a low fixed-noise pattern, CCDs also suffer from a number of weaknesses, which include limited readout rates, high voltage operations, and success in integrating CCDs with CMOS-based microprocessors.

Figure 1:
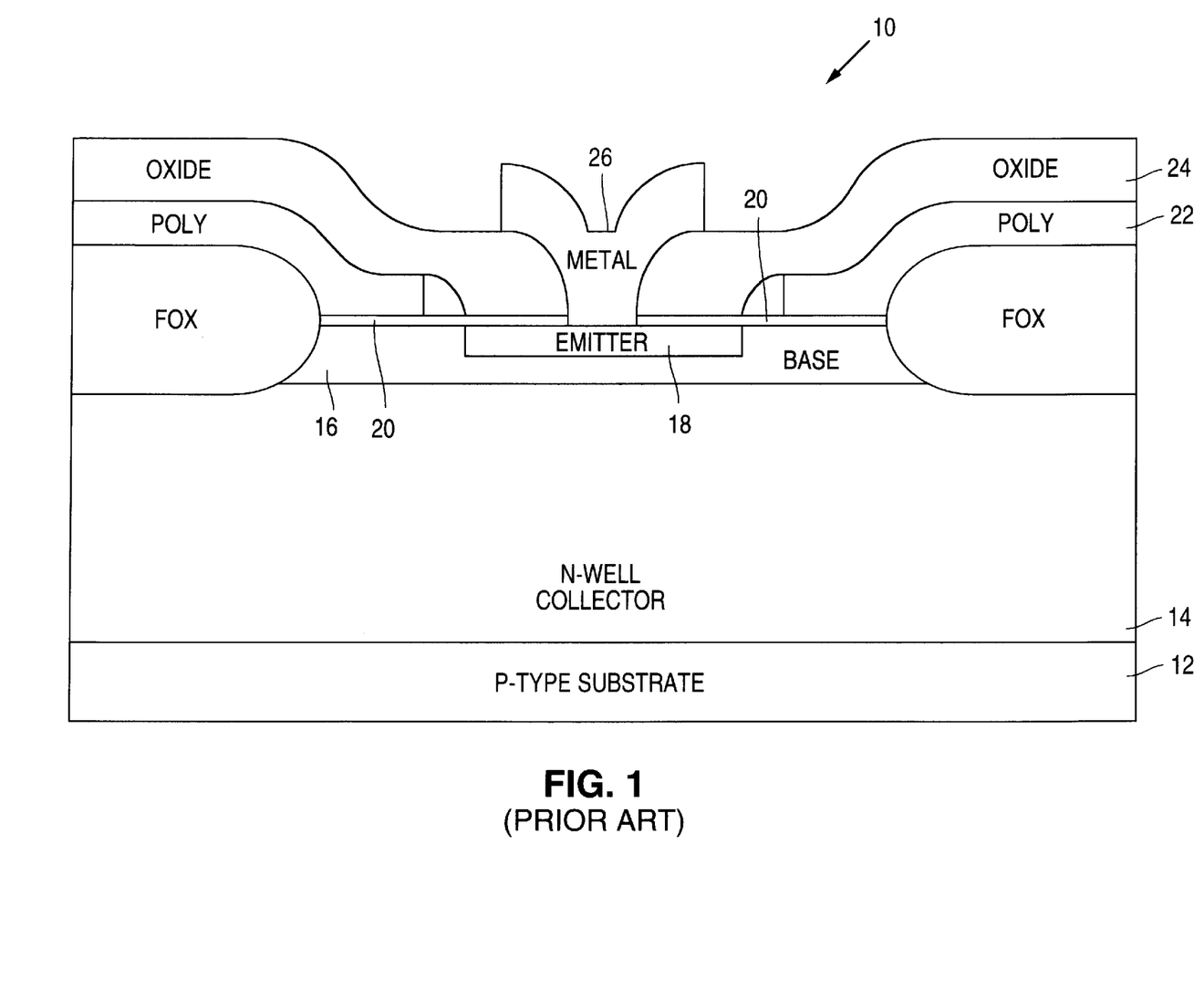
FIG. 1 is a cross-sectional diagram illustrating a conventional vertical bipolar-based active pixel sensor cell 10.

To overcome the limitations of CCD-based imaging circuits, more recent imaging circuits use vertical bipolar-based active pixel sensor cells to convert a pixel of light energy into an electrical signal. FIG. 1 shows an example of a conventional vertical bipolar-based active pixel sensor cell 10.

As shown in FIG. 1, cell 10 includes an n-well 14, which functions as a collector, formed in a p-type substrate 12; a p-type region 16, which functions as a base, formed in collector region 14; and an n+ region 18, which functions as an emitter, formed in base region 16.

In addition, cell 10 also includes a field oxide region FOX formed in collector region 14 adjoining base region 16, a layer of gate oxide 20 formed on base region 16 and an outer portion of emitter region 18, and an n+ polysilicon (poly) line 22 formed on the field oxide region FOX and a portion of the layer of gate oxide 20 formed over base region 16.

Poly line 22 is conventionally doped n+ rather than p+ because additional masking steps are required to dope poly line 22 with a p-type material. In addition, a p-type material heavily implanted into poly line 22 can easily diffuse into and damage the layer of gate oxide 20.

As further shown in FIG. 1, cell 10 additionally includes a layer of oxide 24 formed on polysilicon line 22 and a portion of the layer of gate oxide 20, and a metal contact 26 formed on a center area of emitter region 18 adjoining the layer of oxide 24.

Operation of active pixel sensor cell 10 is performed in two steps: an image integration step, where the light energy is collected and converted into an electrical signal; and a signal readout step, where the signal is read out.

At the beginning of the image integration step, the base-emitter junction is reverse biased by applying a fixed voltage to poly line 22. The voltage applied to poly line 22 is capacitively coupled to base region 16 by a coupling capacitor that utilizes poly line 22 as the top plate, gate oxide layer 20 as the dielectric, and base region 16 as the bottom plate. In addition, the collector-base junction is also reverse-biased by applying a fixed voltage, such as Vcc, to collector region 14.

During the image integration step, light energy, in the form of photons, strikes cell 10, thereby creating a number of electron-hole pairs. Under these conditions, the holes formed in base region 16 remain in base region 16, while the holes formed in collector region 14 and emitter region 18 diffuse to base region 16, where each additional hole in base region 16 increases the charge on base region 16.

At the end of the integration step, cell 10 is read out by pulsing poly line 22 with a positive voltage which, in turn, increases the voltage on base region 16. The increased voltage on base region 16, in combination with the increased charge due to the collected holes, forward-biases the base-emitter junction causing an amplified image current to flow up from emitter region 18 into metal contact 26 that is proportional to the number of collected holes. At the end of the read-out step, cell 10 returns to the image integration step by pulsing poly line 22 back to the fixed voltage.

When utilized in an array of cells, metal contact 26 is connected to all of the emitters in a column of cells so that a single column sensing circuit can be used to sequentially process the amplified image current from each cell (row) in the column.

Recently, due to the continued miniaturization of transistors, there has been a move to integrate local image processing transistors into each active pixel sensor cell. One problem with cell 10, however, is that the vertical nature of the amplified image current makes it difficult to fabricate local image processing transistors with each cell.

Thus, there is a need for a bipolar-based active pixel sensor cell that can be easily integrated with local image processing transistors.

SUMMARY OF THE INVENTION

Conventionally, it is difficult to integrate local image processing transistors with bipolar-based active pixel sensor cells, which are based on vertically-formed npn or pnp transistors, due to the vertical current produced by these cells. The present invention simplifies the integration task by utilizing the horizontal current provided by the parasitic bipolar action of a MOS transistor.

An active pixel sensor cell in accordance with the present invention, which is formed on a semiconductor bulk, includes a first layer of insulation that is formed on the semiconductor bulk, and a body of a first conductivity type that is formed on the first layer of insulation.

In addition, the cell of the present invention also includes spaced-apart source and drain regions of a second conductivity type which are formed in the body to contact the first layer of insulation, and a channel region of the body which is defined to extend downward from a top surface of the body and from the source region to the drain region. Further, the channel region has a substantially uniform doping concentration.

In accordance with the present invention, a charge collection region of the body is defined to adjoin the source and drain regions, and fall outside of any region lying between the source and drain regions.

In addition, a second layer of insulation material is formed on the body, and a gate is formed on the second layer of insulation over the channel region and a portion of the charge collection region.

A better understanding of the features and advantages of the present invention will be obtained by reference to the following detailed description and accompanying drawings which set forth an illustrative embodiment in which the principals of the invention are utilized.

DETAILED DESCRIPTION

Figure 2:
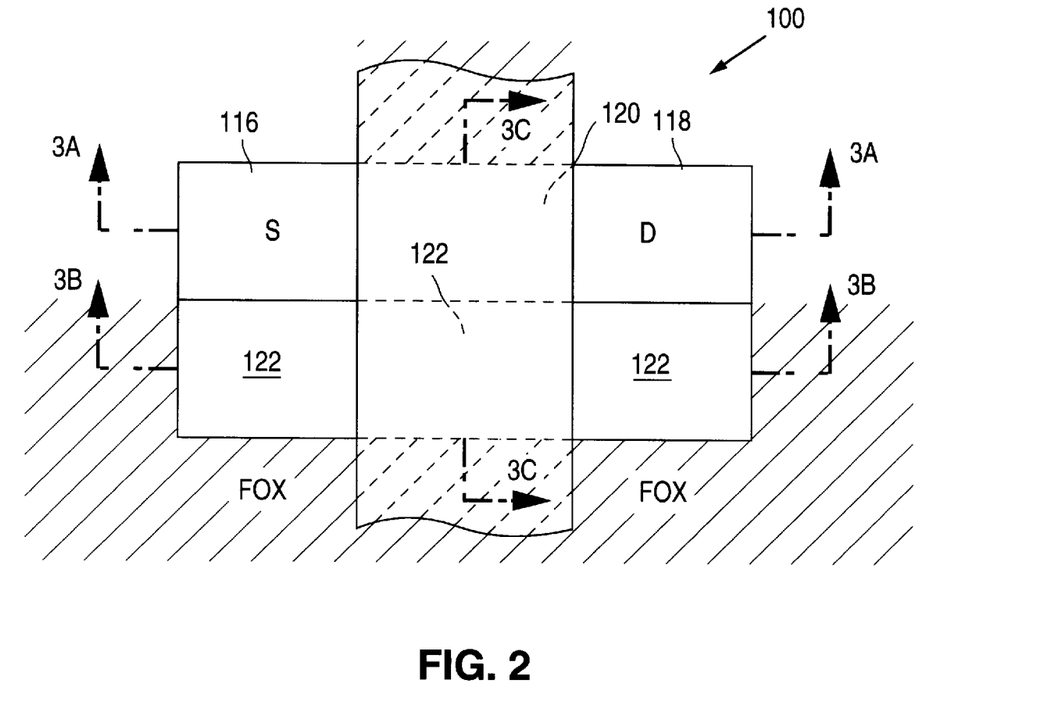
FIG. 2 is a plan view illustrating a MOS-based active pixel sensor cell 100 in accordance with the present invention.
Figure 3A:
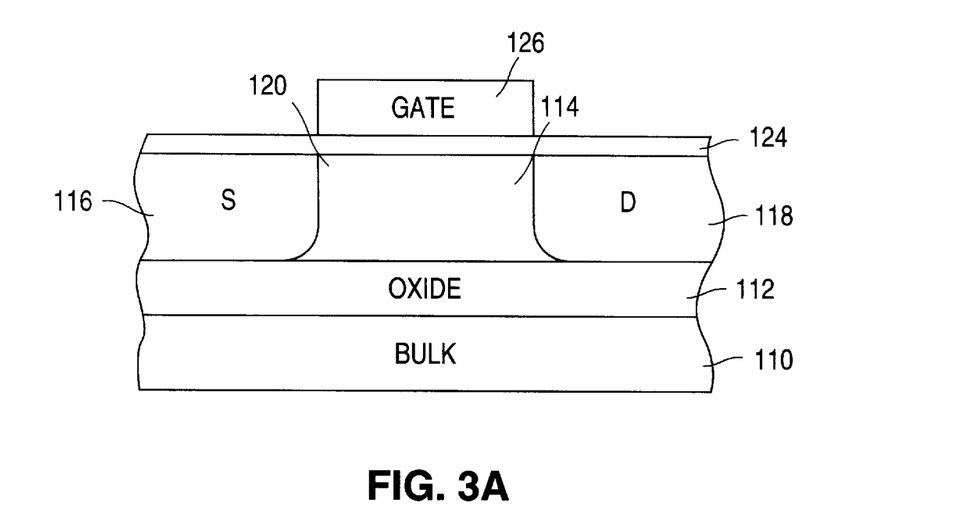
FIGS. 3A, 3B, and 3C are cross-sectional views taken along lines 3A—3A, 3B—3B, and 3C—3C of FIG. 2., respectively.
Figure 3B:
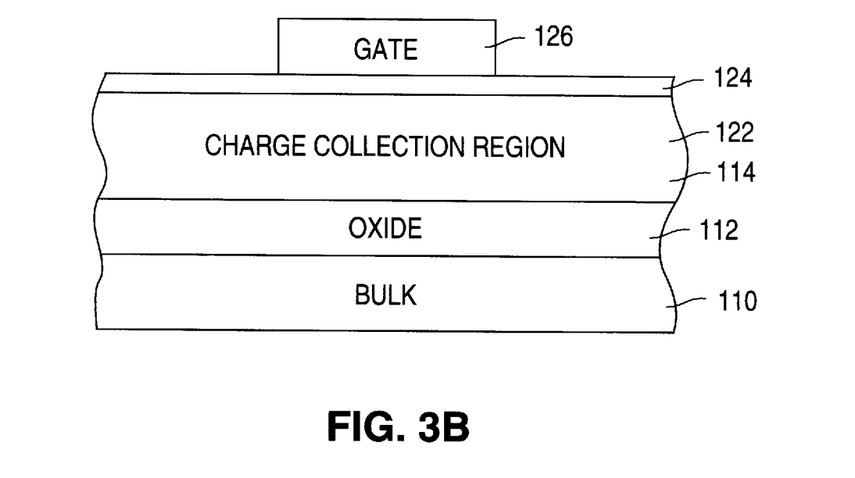
Figure 3C:
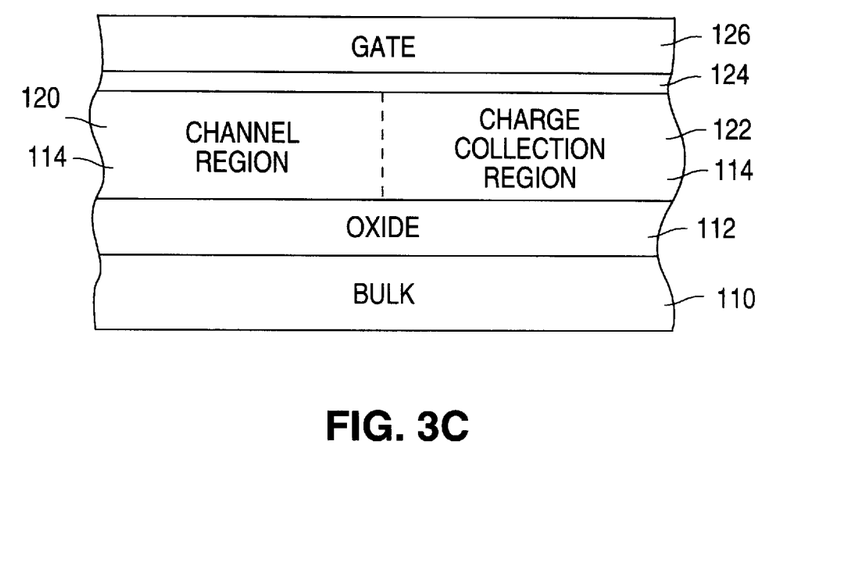

FIG. 2 shows a plan view that illustrates a MOS-based active pixel sensor cell 100 in accordance with the present invention. FIGS. 3A, 3B, and 3C show cross-sectional views taken along lines 3A—3A, 3B—3B, and 3C—3C of FIG. 2., respectively.

As shown in FIGS. 2 and 3A–3C, cell 100, which is formed on a semiconductor bulk 110, includes a layer of insulation material 112 which is formed on bulk 110, and a thin (less than approximately 0.15 microns) p-type silicon layer 114, referred to as the p-body, which is formed on insulation layer 112. The wafer with the thin silicon layer on the layer of insulation material on the bulk is commonly known as silicon-on-insulator (SOI) and is available commercially.

In addition, cell 100 also includes spaced-apart source and drain regions 116 and 118 which are formed in p-body 114 to contact insulation layer 112, and a channel region 120 of p-body 114 which is defined between source and drain regions 116 and 118. As shown, channel region 120 has a substantially uniform doping level.

In accordance with the present invention, cell 100 further includes a first charge collection region 122 of p-body 114 which is defined to adjoin source and drain regions 116 and 118, and fall outside of the regions which lie between source and drain regions 116 and 118.

As also shown in FIGS. 2 and 3A–3C, cell 100 additionally includes a layer of gate oxide 124 which is formed over p-body 114, and a polysilicon gate 126 which is formed on gate oxide layer 124 over channel region 120 and a portion of charge collection region 122.

In addition, field oxide regions FOX are formed in p-body 114 to contact insulation layer 112 so that the combined p-body regions of channel region 120 and charge collection region 122 are totally isolated by field oxide regions FOX, source and drain regions 116 and 118, insulation layer 112, and oxide layer 124.

Figure 4:
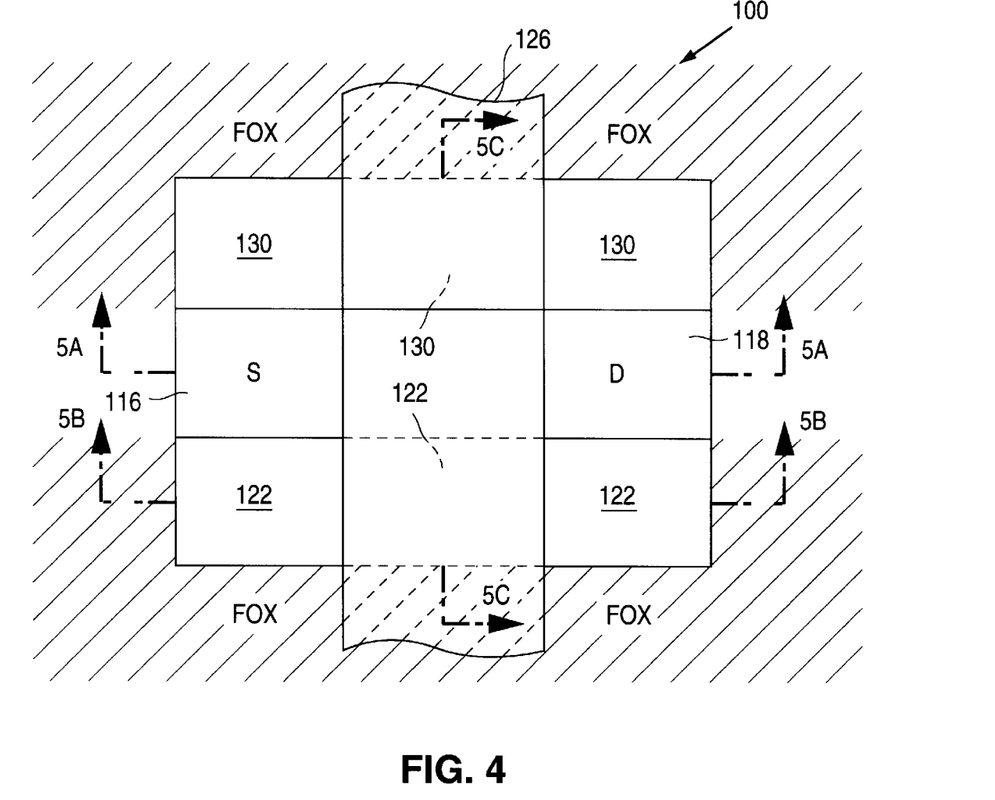
FIG. 4 is a plan view illustrating an alternate embodiment of active pixel sensor cell 100 in accordance with the present invention.
Figure 5A:
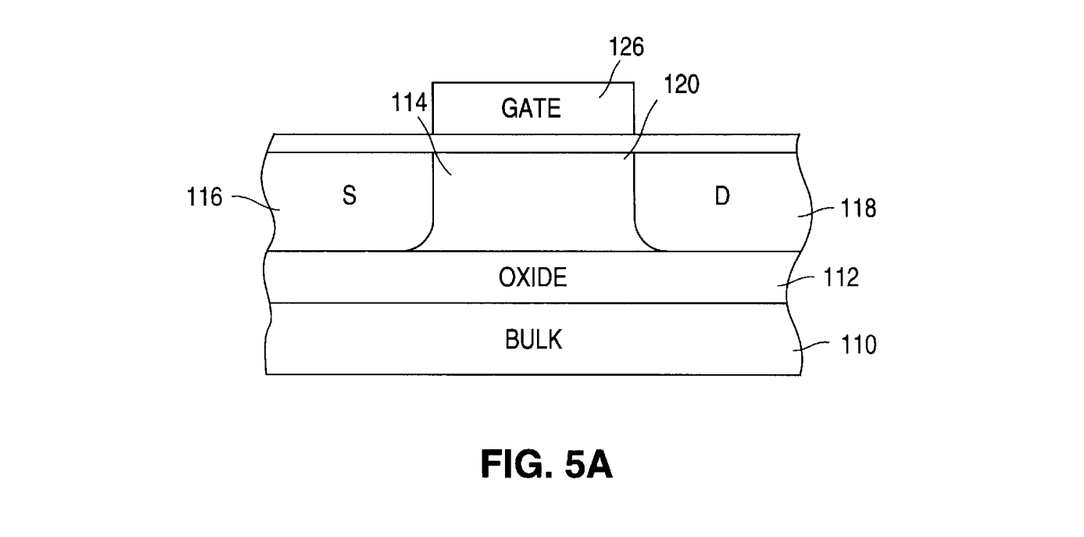
FIGS. 5A, 5B, and 5C are cross-sectional views taken along lines 4A—4A, 4B—4B, and 4C—4C of FIG. 4., respectively.
Figure 5B:
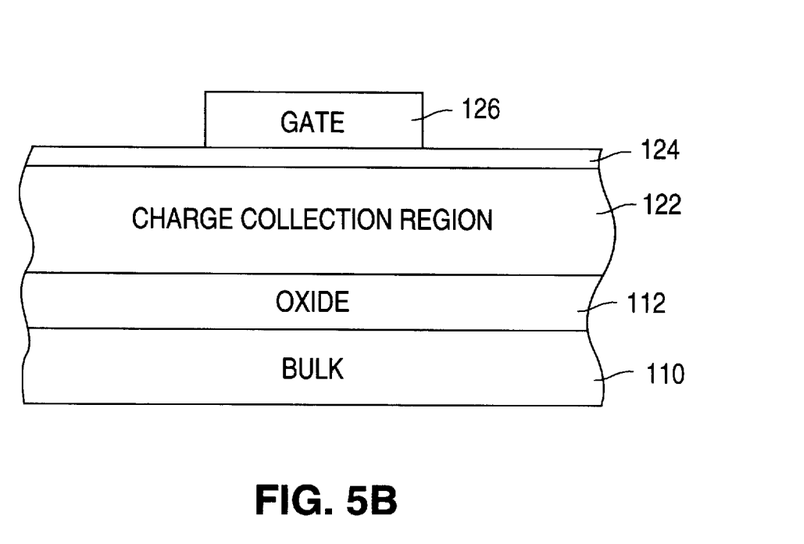
Figure 5C:
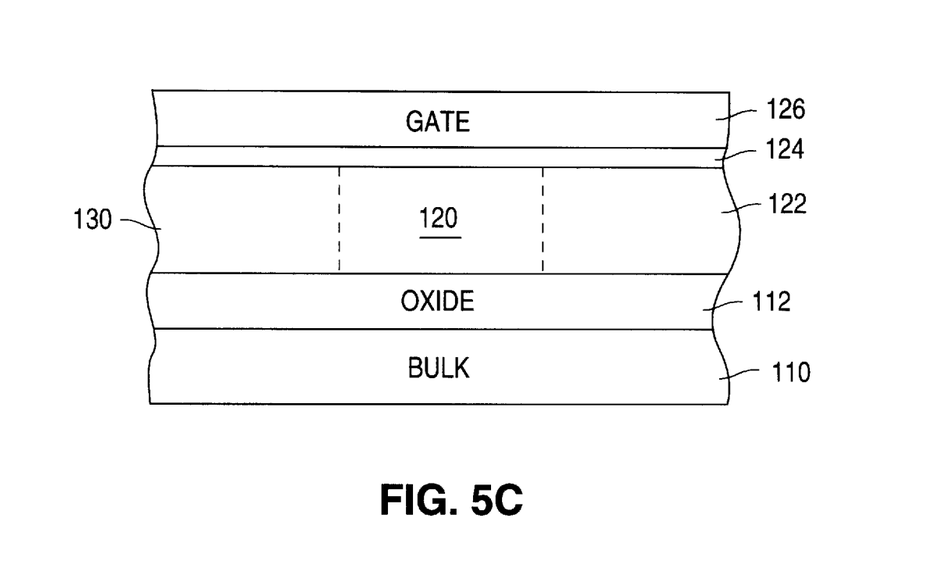

FIG. 4 shows a plan view that illustrates an alternate embodiment of active pixel sensor cell 100 in accordance with the present invention. FIGS. 5A, 5B, and 5C show cross-sectional views taken along lines 4A—4A, 4B—4B, and 4C—4C of FIG. 4., respectively.

As shown in FIGS. 4 and 5A–5C, cell 100 further includes a second charge collection region 130 of p-body 114 which is defined apart from region 122 to also adjoin source and drain regions 116 and 118, and fall outside of the regions which lie between source and drain regions 116 and 118.

The operation of active pixel sensor cell 100 is performed in two steps: an image integration step, where the light energy is collected and converted into an electrical charge; and a readout step, where the charge is read out.

Throughout the image integration period, a voltage is applied to gate 126 which is sufficient to reverse-bias both the source-to-body and drain-to-body junctions, and suppress the MOS transistor action of cell 100, i.e., prevent the formation of a surface inversion current.

The voltage applied to gate 126 is capacitively coupled to channel region 120 and charge collection region 122 (and 130) of p-body 114 by a coupling capacitor that utilizes poly gate 126 as the top plate, gate oxide layer 124 as the dielectric, and regions 120 and 122 as the bottom plate.

For example, by biasing source region 116 to the power supply voltage Vcc, placing a voltage near ground (as a result of the previous readout step) on drain region 118, and applying −3 to −5 volts to gate 126, a voltage of approximately −1.5 to −2.5 volts will appear on regions 120 and 122 (and 130) which, in turn, is sufficient to reverse-bias both the source-to-body and drain-to-body junctions, and suppress the MOS transistor action of cell 100.

During image integration, cell 100 collects light energy in the form of photons which penetrate into body 114, thereby creating a number of electron-hole pairs. Cell 100 is designed to limit recombination between the newly formed electron-hole pairs.

The photogenerated holes formed in channel region 120 and charge collection region 122 (and 130) are attracted to the surface of regions 120 and 122 (and 130) which lie under gate 126, while the holes formed in regions 116 and 118 diffuse to the source-to-body and drain-to-body junctions where they are swept into regions 120 and 122 (and 130) under the influence of the junction electric fields.

On the other hand, the electrons formed in channel region 120 and charge collection region 122 (and 130), which are repelled from the surface of regions 120 and 122 (and 130) that lie under gate 126, diffuse to the junction depletion regions where they are swept into source and drain regions 116 and 118 under the influence of the junction electric fields.

Thus, at the end of the integration period, channel region 120 and charge collection region 122 (and 130) of p-body 114 will have collected some number of image holes which have a total charge that is proportional to the intensity of the received light energy.

Following the integration period, the charge collected in regions 120 and 122 (and 130) is read out by pulsing the voltage applied to gate 126 back to near ground such that the MOS transistor action of cell 100 continues to be suppressed, the drain-to-body junction becomes forward-biased, and the source-to-body junction remains reverse-biased.

Under these bias conditions, image holes flow from the p-body area of channel region 120 and charge collection region 122 (and 130), which function as the p-base of a parasitic npn bipolar transistor, into drain region 118, which functions as the emitter of the parasitic bipolar transistor, as an image (base) current, thereby triggering the parasitic bipolar action of cell 100.

As a result, a gain current flows from source region 116, which functions as the collector of the parasitic bipolar transistor, through base region 120/122 into emitter region 118. The total charge flowing out of emitter region 118, which represents the image current and the gain current, is then sensed by a column sensing circuit (not shown) to determine the number of collected photons.

Thus, in accordance with the present invention, a horizontal image current flows from source/collector region 116 to drain/emitter region 118 in lieu of the vertical image of current that flows in cell 10 of FIG. 1 by utilizing the parasitic bipolar action of MOS-based cell 100.

The present invention provides a number of advantages when compared to the bipolar-based cell of FIG. 1, and include an improved fill factor, greater noise reduction, reduced column capacitance, and reduced junction leakage.

With respect to the fill factor, the formation of the n+ source and drain junctions over insulation layer 112 results in a smaller junction capacitance at the p-base 120/122 to collector 116 and p-base 120/122 to emitter 118 junctions. As a result, less coupling capacitance is needed between poly gate 126 and p-base 120/122 which, in turn, increases the area of base 120/122 that can be utilized to collect light, thereby providing a greater fill factor.

Further, the smaller base-to-emitter and base-to-collector junction capacitances also reduce a displacement current (noise) which occurs when the gate voltage is switched. As a result, cell 100 provides greater noise suppression than does cell 10.

With respect to the column capacitance, the smaller drain junction capacitance also leads to a significantly smaller total column capacitance in an array of cells. With a smaller total column capacitance, the sensitivity and speed of the charge sensing circuit can be improved significantly.

In addition to the above, the smaller size of cell 100 also reduces the size of the base-to-emitter and base-to-collector junction areas which, in turn, reduces the size of the junction leakage current. As a result, the detection sensitivity of cell 100 is increased.

The advantages provided by the present invention also include CMOS compatibility and base isolation. Since cell 100 is formed as a MOS transistor and only utilizes the parasitic bipolar action of the MOS transistor, cell 100 is easily integrated into a standard CMOS process flow.

Further, by utilizing a thin layer of silicon to form body 114, and forming source and drain regions 116 and 118 and field oxide regions FOX to contact insulation layer 112, each cell 100 is completely isolated from adjacent cells.

Figure 6:
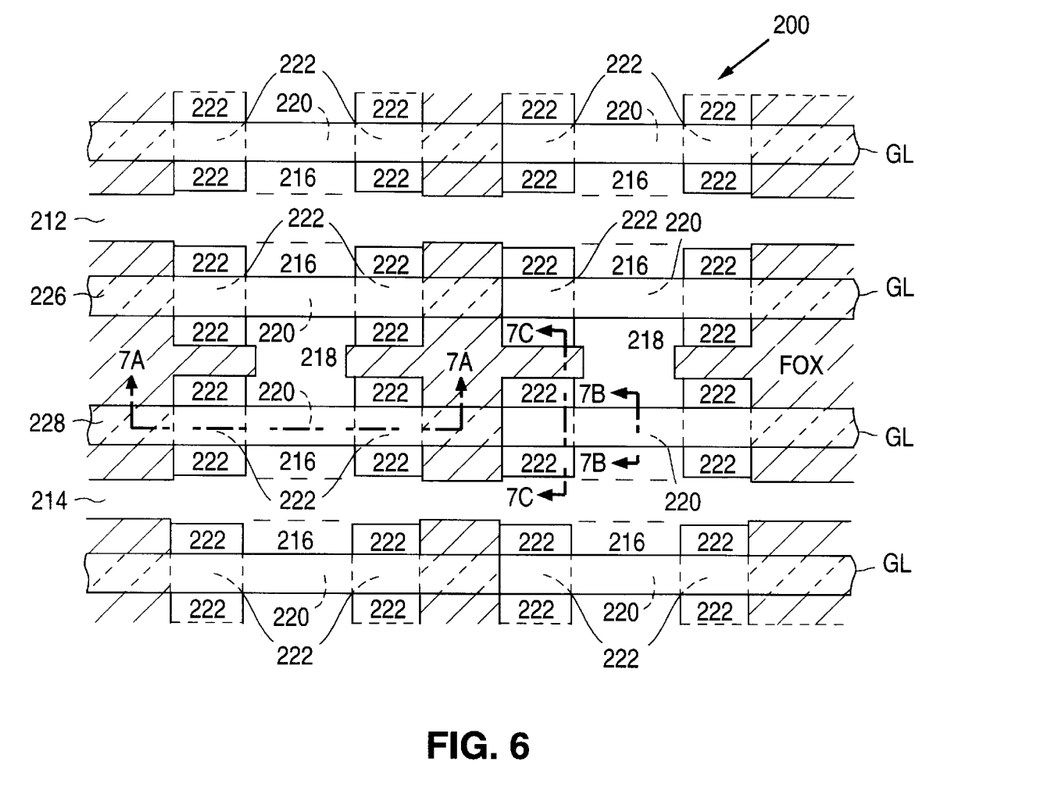
FIG. 6 is a plan view illustrating an array 200 of cells 100 in accordance with the present invention.
Figure 7A:
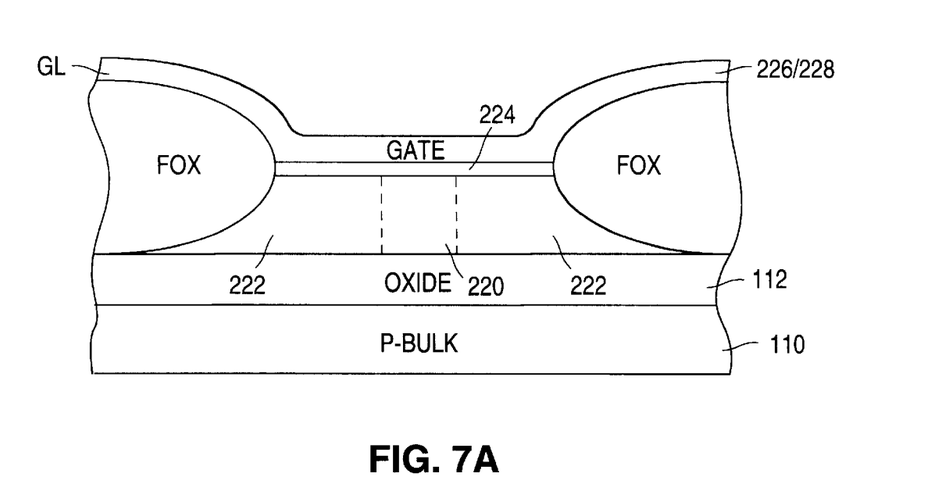
FIGS. 7A, 7B, and 7C are cross-sectional views taken along lines 7A—7A, 7B—7B, and 7C—7C of FIG. 6., respectively.
Figure 7B:
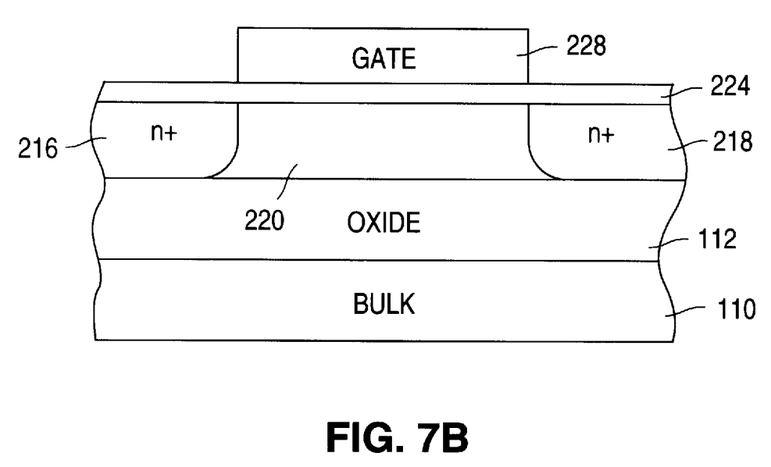
Figure 7C:
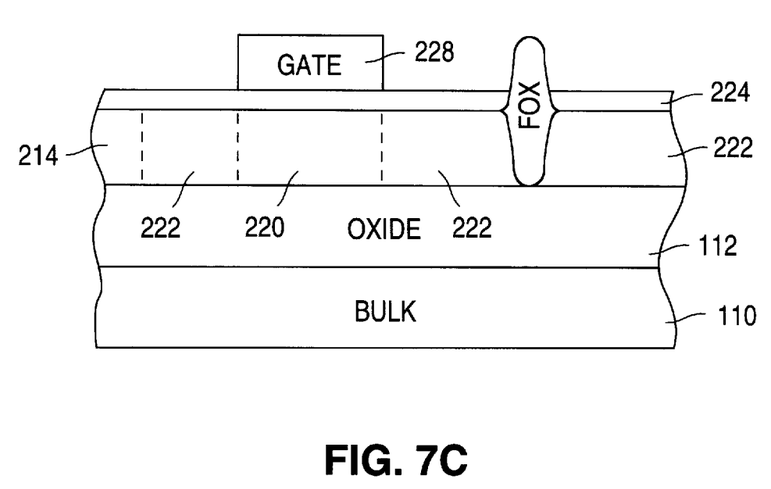

FIG. 6 shows a plan view that illustrates an array 200 of cells 100 in accordance with the present invention. FIGS. 7A, 7B, and 7C show cross-sectional views taken along lines 7A—7A, 7B—7B, and 7C—7C of FIG. 6., respectively.

As shown in FIGS. 6 and 7A–7C, array 200 includes spaced-apart first and second n+ source lines 212 and 214, respectively, which are formed in p-type body 114 to contact insulation layer 112. As further shown, the first and second source lines 212 and 214 each have a plurality of source regions 216 which extend away from the source lines 212 and 214.

Array 200 also includes a plurality of spaced-apart n+ drain regions 218 which are formed in body 114 to contact insulation layer 112 between the first and second source lines 212 and 214, and a plurality of channel regions 220 of p-body 114 which are defined in body 114 so that each channel region 220 adjoins a source region 216 and a drain region 218.

In accordance with the present invention, array 200 further includes a plurality of charge collection regions 222 of p-body 114 which are defined in body 114 so that each charge collection region 222 adjoins a source region 216 and a drain region 218, and falls outside of any region lying between the source and drain regions 216 and 218.

Further, array 200 additionally includes a layer of gate oxide 224 which is formed on p-body 114, and a plurality of gate lines GL which are formed on gate oxide layer 224 between the first and second source lines 212 and 214 so that a first gate line 226 is formed over a first plurality of horizontally-adjacent channel regions 220 and a portion of each of a first plurality of charge collection regions 222, and a second gate line 228 is formed over a second plurality of horizontally-adjacent channel regions 220 and a portion of each of a second plurality of charge collection regions 222.

As also shown in FIGS. 6 and 7A–7C, a plurality of "plus-shaped" field oxide regions FOX are also formed in body 114 so that each field oxide region FOX adjoins first and second source lines 212 and 214, horizontally adjacent drain regions 218, and insulation layer 112.

As a result, the portion of body 114 which includes a channel region 220 and an adjoining charge collection region 222 are totally surrounded by field oxide regions FOX, first and second source lines 212 and 214, a drain region 218, insulation layer 112, and oxide layer 224.

It should be understood that various alternatives to the embodiment of the invention described herein may be employed in practicing the invention. For example, cell 100 can be based on a PMOS transistor in lieu of an NMOS transistor.

Thus, it is intended that the following claims define the scope of the invention and that methods and structures within the scope of these claims and their equivalents be covered thereby.

What is claimed is:

1. An active pixel sensor cell formed on a semiconductor bulk, the cell comprising:

a first layer of insulation formed on the semiconductor bulk;

a body of a first conductivity type formed on the first layer of insulation;

spaced-apart source and drain regions of a second conductivity type formed in the body, the source and drain regions contacting the first layer of insulation;

a channel region of the body defined to extend downward from a top surface of the body and from the source region to the drain region, the channel region having a substantially uniform doping concentration;

a first charge collection region of the body defined to adjoin the source and drain regions, and fall outside of any region lying between the source and drain regions;

a second layer of insulation formed on the body; and a gate formed on the second layer of insulation over the channel region and a portion of the charge collection region.

2. The cell of claim 1 wherein the first layer of insulation comprises a layer of oxide.

3. The cell of claim 1 wherein the second layer of insulation comprises a layer of oxide.

4. The cell of claim 1 and further comprising field oxide regions formed in the body to adjoin the channel region and the charge collection region, and to contact the first layer of insulation so that a body region defined by the channel region and the first charge collection region is totally surrounded by the first layer of insulation, the source and drain regions, the field oxide regions, and the second layer of insulation.

5. The cell of claim 1 and further including a second charge collection region of the body defined apart from the first charge collection region to adjoin the source and drain regions, and fall outside of any region lying between the source and drain regions.

6. The cell of claim 5 and further comprising field oxide regions formed to adjoin the first and second charge collection regions, and to contact the first layer of insulation so that a body region defined by the channel region and the first and second charge collection regions is totally surrounded by the first layer of insulation, the source and drain regions, the field oxide regions, and the second layer of insulation.

7. The cell of claim 6 wherein the first and second layers of insulation comprise oxide.

8. A method for collecting light energy in an active pixel sensor cell formed on a semiconductor bulk, the cell comprising:

a first layer of insulation formed on the semiconductor bulk;

a body of a first conductivity type formed on the first layer of insulation;

spaced-apart source and drain regions of a second conductivity type formed in the body, the source and drain regions contacting the first layer of insulation;

a channel region of the body defined to extend downward from a top surface of the body and from the source region to the drain region, the channel region having a substantially uniform doping concentration;

a first charge collection region of the body defined to adjoin the source and drain regions, and fall outside of any region lying between the source and drain regions;

a second layer of insulation formed on the body; and a gate formed on the second layer of insulation over the channel region and a portion of the charge collection region, the method comprising the steps of:
applying a negative voltage to the gate for an integration period such that a source-to-body junction and a drain-to-body junction are reverse-biased;
collecting photons during the integration period; and
applying a read-out voltage more positive than the negative voltage to the gate for a read-out period following the integration period such that the source-to-body junction is reverse-biased and the drain-to-body junction is forward-biased.

9. The method of claim 8 wherein the read-out voltage is insufficient to invert a top surface of the channel region.

10. The method of claim 8 wherein the read-out voltage causes a horizontal current to flow from the source region to the drain region which is proportional to a number of photons collected during the collecting step.

11. A method of forming an active pixel sensor cell on a semiconductor bulk, the method comprising the steps of:

forming a first layer of insulation on the semiconductor bulk;

forming a body of a first conductivity type on the first layer of insulation;

forming spaced-apart source and drain regions of a second conductivity type in the body, the source and drain regions contacting the first layer of insulation;

defining a channel region of the body to extend downward from a top surface of the body and from the source region to the drain region, the channel region having a substantially uniform doping concentration;

defining a first charge collection region of the body to adjoin the source and drain regions, and fall outside of any region lying between the source and drain regions;

forming a second layer of insulation on the body; and forming a gate on the second layer of insulation over the channel region and a portion of the charge collection region.

12. The method of claim 11 and further comprising the step of forming field oxide regions in the body to adjoin the channel region and the charge collection region, and to contact the first layer of insulation so that a body region defined by the channel region and the first charge collection region is totally surrounded by the first layer of insulation, the source and drain regions, the field oxide regions, and the second layer of insulation.

13. The method of claim 11 and further comprising the step of defining a second charge collection region of the body apart from the first charge collection region to adjoin the source and drain regions, and fall outside of any region lying between the source and drain regions.

14. The method of claim 13 and further comprising the step of forming field oxide regions to adjoin the first and second charge collection regions, and to contact the first layer of insulation so that a body region defined by the channel region and the first and second charge collection regions is totally surrounded by the first layer of insulation, the source and drain regions, the field oxide regions, and the second layer of insulation.

15. An array of active pixel sensor cells formed on a semiconductor bulk, the array comprising:

a first layer of insulation formed on the semiconductor bulk;

a body of a first conductivity type formed on the first layer of insulation;

spaced-apart first and second source lines of a second conductivity type formed in the body to contact the first layer of insulation, the first and second source lines each having a plurality of source regions which extend away from the source lines;

a plurality of drain regions of a second conductivity type formed in the body to contact the first layer of insulation between the first and second source lines;

a plurality of channel regions of the body defined so that each channel region adjoins a source region and a drain region;

a plurality of charge collection regions of the body defined so that each charge collection region adjoins a drain region and a source region, and falls outside of any region lying between the source and drain regions;

a second layer of insulation formed on the body; and a plurality of gate lines formed on the second layer of insulation so that a first gate line is formed over a first plurality of channel regions and a portion of a first plurality of charge collection regions, and a second gate line is formed over a second plurality of channel regions and a portion of a second plurality of charge collection regions.

16. The array of claim 15 and further comprising a plurality of plus-shaped field oxide regions formed in the body so that each field oxide region adjoins the first and second source lines, horizontally adjacent drain regions, and the first layer of insulation.

17. The array of claim 16 wherein each portion of the body that includes a channel region and an adjoining charge collection region are totally surrounded by field oxide regions, first and second source lines, a drain region, and the first and second layers of insulation.

* * * * *